(12) United States Patent
Raghavendra et al.

(10) Patent No.: US 10,180,826 B2
(45) Date of Patent: Jan. 15, 2019

(54) ESTIMATION OF BIT WIDTHS OF VARIABLES BASED ON LIVENESS

(71) Applicant: Advanced Micro Devices, Inc., Sunnyvale, CA (US)

(72) Inventors: Prakash Sathyanath Raghavendra, Bangalore (IN); Dibyendu Das, Bangalore (IN); Arun Rangasamy, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 24 days.

(21) Appl. No.: 14/920,295

(22) Filed: Oct. 22, 2015

(65) Prior Publication Data
US 2017/0115970 A1  Apr. 27, 2017

(51) Int. Cl.
*G06F 9/45* (2006.01)
*G06F 8/41* (2018.01)

(52) U.S. Cl.
CPC .......... *G06F 8/433* (2013.01); *G06F 8/4432* (2013.01); *G06F 8/4441* (2013.01)

(58) Field of Classification Search
CPC ..................................... G06F 8/433
USPC ......................................... 717/156
See application file for complete search history.

(56) References Cited

U.S. PATENT DOCUMENTS

| | | | |
|---|---|---|---|
| 5,068,823 A | 11/1991 | Robinson | |
| 5,327,561 A | 7/1994 | Choi | |
| 7,000,213 B2 | 2/2006 | Banerjee | |
| 7,480,603 B1 | 1/2009 | San | |
| 8,984,488 B2 | 3/2015 | Bhatt | |
| 2008/0098336 A1 | 4/2008 | Tanimoto | |
| 2010/0095286 A1 | 4/2010 | Kaplan | |
| 2010/0211760 A1 | 8/2010 | Bernhard | |

OTHER PUBLICATIONS

Mark Stephenson et al., "Bitwidth Analysis with Application to Silicon Compilation", 2000, ACM, pp. 108-120.*
Sriraman Tallam et al., "Bitwidth Aware Global Register Allocation", Jan. 2003, ACM, pp. 85-96.*
Martin Hirzel, Amer Diwan, Antony Hoskin, "On The Usefulness of Liveness for Garbage Collection and Leak Detection", ECOOP 2001, LNCS 2072, pp. 181-206.
HSA Foundation, "HSA Platform System Architecture Specification", Jan. 23, 2015, 69 pages.
Mark Stephenson, Jonathan Babb, Saman Amarasinghe, "Bitwidth Analysis With Application to Silicon Compilation", PLDI '00 Proceedings of the ACM SIGPLAN 2000 conference on Programming language design and implementation, pp. 108-120.

* cited by examiner

*Primary Examiner* — Wei Y Zhen
*Assistant Examiner* — Lanny Ung

(57) ABSTRACT

A compiler generates transfer functions for blocks of a program during compilation of the program. The transfer functions estimate bit widths of variables in the blocks based on numbers of bits needed to carry out at least one instruction in the blocks and whether the variables are live in the blocks. For example, a transfer function may return a number indicating how many bits of a variable are needed to execute a current instruction as a function of the number of bits of the variable used by the program in subsequent instructions. Numbers of bits to represent the variables in the compiled program based on the transfer functions.

20 Claims, 6 Drawing Sheets

… (1)

ESTIMATION OF BIT WIDTHS OF VARIABLES BASED ON LIVENESS

BACKGROUND

Field of the Disclosure

The present disclosure relates generally to processing systems and, more particularly, to compilation of programs executed by processing systems.

Description of the Related Art

Conventional compilers assume that each variable in a program must be represented by a fixed number of bits associated with the declared type of the variable. For example, all variables declared as the type integer may be represented by 64 bits. Some high-level programming languages allow variables of the same type, such as type pointer, to be represented by different numbers of bits. For example, the specification of the large machine model of the heterogeneous system architecture (HSA) intermediate language (HSAIL) uses 64 bits to represent pointers to memory locations in a global address space and 32 bits to represent pointers to memory locations in a local address space shared by tasks in a workgroup and the private address spaces of the individual tasks. However, the variables in a program may not actually use all of the allocated bits during execution of the program. Representing the variables by the full number of bits allocated to the corresponding variable type wastes computational resources. For example, representing all of the pointers in HSAIL variables by 64 bits requires applying computationally expensive 64-bit address calculations to determine addresses to memory locations in the global, local, and private address spaces.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
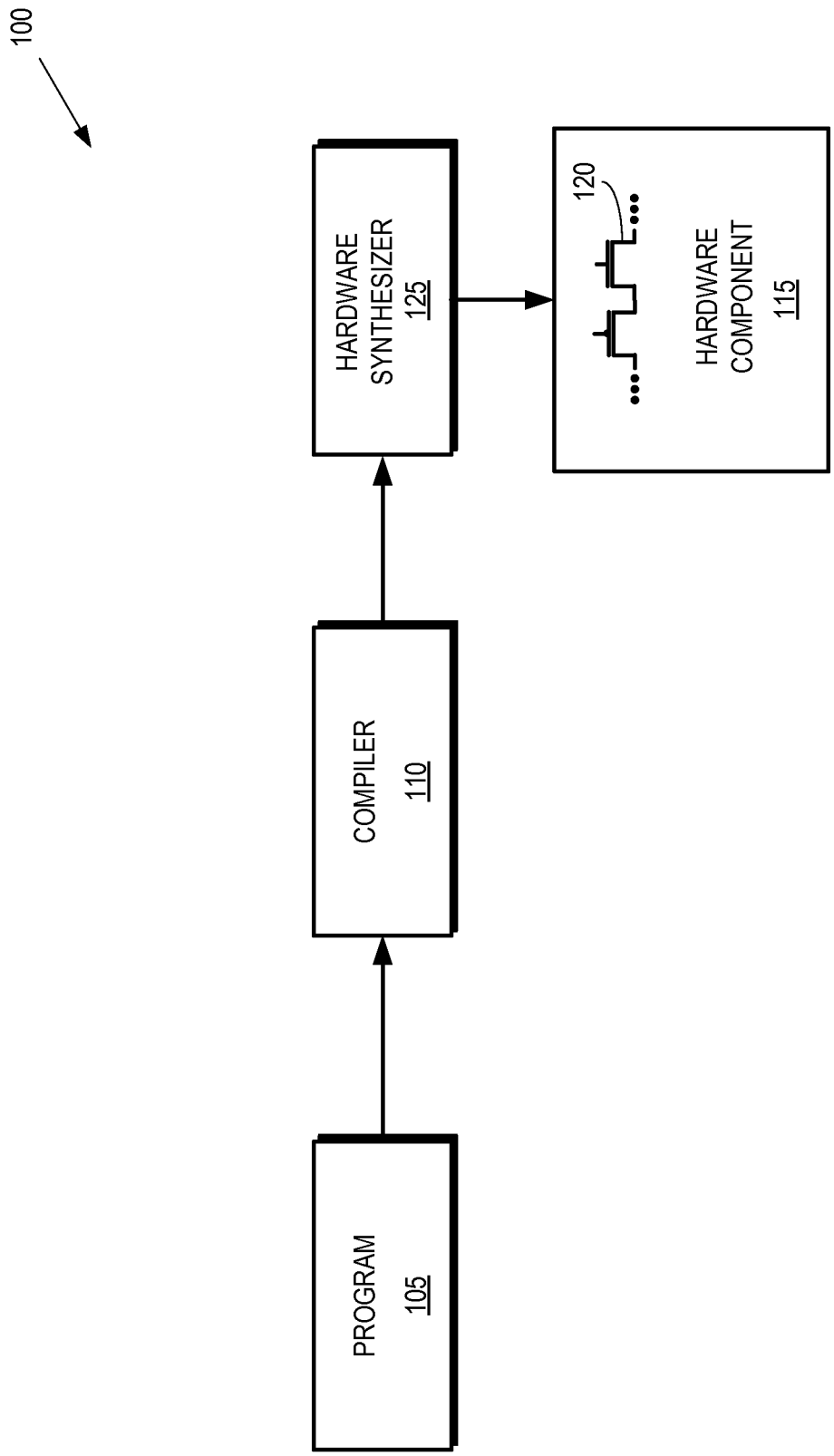
FIG. 1 is a block diagram of a processing system according to some embodiments.

Bit-width analysis can be used during compilation to determine the smallest bit size that can be used to represent each variable in the compiled program while also guaranteeing that correct program semantics are preserved. Although applying bit-width analysis to reduce the number of bits used to represent variables can degrade the performance and power consumption properties of general-purpose processor systems, e.g., because of the overhead from packing or unpacking and the need for sign/zero extensions and truncations, reducing the bit size of the variables during compilation can make significant positive impacts on the power consumption, area, or speed of hardware synthesized from programs written in high-level languages like C. A compiler can determine the bit sizes of variables by computing a range that indicates an upper and a lower bound on the values taken by each variable during execution of the program. The value range for each variable is then propagated both forward and backward through a control flow graph of the program during compilation. Value range propagation typically converges on a value range for each variable after multiple iterations of the bidirectional propagation of the value range forward and backward through the program. Consequently, value range propagation is computationally intensive, data intensive, and typically requires user input to terminate the analysis after a fixed number of iterations.

The performance of some programs (such as a program used to synthesize hardware) can be improved by allocating numbers of bits to variables in the program at compile time using a backwards flow analysis of the program based on transfer functions representative of bit sizes of instructions in the program. The transfer functions indicate a minimum number of bits needed to represent the variables in the instruction as a function of a number of bits needed to carry out the instruction and whether the variable is live at the instruction. As defined herein, the term "live" indicates that the variable is going to be read before a write operation changes the value of the variable. For example, a variable is a live variable if the variable holds a value that is to be used by a subsequent instruction.

Some embodiments of the transfer functions estimate the number of bits needed to represent a variable as a function of numbers of bits used by subsequent instructions to represent the variable and numbers of bits used by subsequent instructions to represent one or more other variables that are used in the current instruction. For example, a transfer function may return a number indicating how many bits of a variable are needed to execute a current instruction as a function of the number of bits of the variable used by the program in subsequent instructions. The numbers of bits allocated to the variables may be initialized to a predetermined value such as zero bits at an exit node of the program. The transfer functions for the instructions in the program are analyzed in reverse order (starting at the exit node) to determine the numbers of bits that are needed to guarantee correct program semantics for the current instruction and the subsequent instructions in the program. The compiler determines the final numbers of bits to allocate to the variables when the backwards flow analysis reaches the entry node of the program. Thus, the bit width analysis is unidirectional and is performed by traversing the program in reverse program order. For example, the compiler may determine a fix-point of the transfer functions using a standard iterative fix-point computation algorithm like Kildall's algorithm.

FIG. 1 is a block diagram of a processing system 100 according to some embodiments. The processing system 100 includes a program 105 that includes instructions that, when executed by a processor, manipulate the processor to perform corresponding processes represented by the instructions. The program 105 may also be referred to as software or code. The program 105 is stored or otherwise embodied in a non-transitory computer readable storage medium for access and use by other entities in the processing system 100. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors. For example, the program 105 may be represented by any of a variety of programming languages or modeling languages, including HSAIL, C, C++, SystemC, Simulink, or MATLAB.

A compiler 110 accesses the program 105, e.g., by reading the program 105 from the non-transitory computer readable storage medium. The compiler 110 transforms the instructions in the program 105 from the source program language into another computer language that may be referred to as the target language. For example, the compiler 110 may transform the instructions in the program 105 from the C language into a binary form known as object code to create an executable program. The compiler 110 may be implemented as software or firmware and hardware that is configured to execute the software or firmware.

Some embodiments of the compiler 110 are silicon compilers that transform hardware specifications encoded by the program 105 into code that represents the functional specification of a hardware component 115. For example, the instructions in the program 105 may conform to the HSAIL specification and the compiler 110 may transform the program 105 into hardware description code that is used to generate the hardware component 115. The hardware description code is represented using at least one Hardware Description Language (HDL), which comprises any of a variety of computer languages, specification languages, or modeling languages for the formal description and design of the circuits of the hardware component 115. The generated HDL code typically represents the operation of circuits 120 of the hardware component 115, the design and organization of the circuits 120, and tests to verify correct operation of the hardware component 115 through simulation. Examples of HDL include Analog HDL (AHDL), Verilog HDL, SystemVerilog HDL, and VHDL. For hardware components 115 implementing synchronized digital circuits, the hardware description code may include register transfer level (RTL) code to provide an abstract representation of the operations of the synchronous digital circuits. For other types of circuitry, the hardware description code may include behavior-level code to provide an abstract representation of the circuitry's operation. The HDL model represented by the hardware description code typically is subjected to one or more rounds of simulation and debugging to pass design verification.

In embodiments where the compiler 110 is a silicon compiler, a hardware synthesizer 125 receives the compiled code from the compiler 110 and uses the compiled code to generate or fabricate the hardware component 115. The hardware component 115 may be an integrated circuit, application-specific integrated circuit (ASIC), a field programmable gate array (FPGA), and the like. Some embodiments of the hardware synthesizer 125 include a synthesis tool that is used to synthesize the hardware description code to generate code representing or defining an initial physical implementation of the circuitry of the hardware component 115. In some embodiments, the synthesis tool generates one or more netlists comprising circuit device instances (e.g., gates, transistors, resistors, capacitors, inductors, diodes, etc.) and the nets, or connections, between the circuits 120 in the hardware component 115. Alternatively, all or a portion of a netlist can be generated manually without the use of a synthesis tool. As with the hardware description code, the netlists may be subjected to one or more test and verification processes before a final set of one or more netlists is generated.

Some embodiments of the hardware synthesizer 125 include one or more electronic design automation (EDA) tools that use netlists produced by the compiler 110 to generate code representing the physical layout of the circuitry of the hardware component 115. This process can include, for example, a placement tool using the netlists to determine or fix the location of each element of the circuitry 120 of the hardware component 115. Further, the hardware synthesizer 125 may include a routing tool that builds on the placement process to add and route the wires needed to connect the circuit elements in accordance with the netlist(s). The resulting code represents a three-dimensional model of the hardware component 115. The code may be represented in a database file format, such as, for example, the Graphic Database System II (GDSII) format. Data in this format typically represents geometric shapes, text labels, and other information about the circuit layout in hierarchical form.

Some embodiments of the hardware synthesizer 125 include portions of a manufacturing facility that is used to fabricate the hardware component 115. The physical layout code (e.g., GDSII code) may be provided to the manufacturing facility, which uses the physical layout code to configure or otherwise adapt fabrication tools of the manufacturing facility (e.g., through mask works) to fabricate the hardware component 115. That is, the physical layout code may be programmed into one or more computer systems, which may then control, in whole or part, the operation of the tools of the manufacturing facility or the manufacturing operations performed therein.

As discussed herein, the performance of the compiled code produced by the compiler 110 may be improved using bit-width analysis to determine the smallest bit size that can be used to represent each variable in the compiled program while also guaranteeing that correct program semantics are preserved. Conventional value range propagation techniques are computationally intensive, data intensive, require multiple forward and backward traversals of the instructions in the program 105, and may require user input for termination. Some embodiments of the compiler 110 therefore use a simpler, although potentially less accurate, unidirectional backwards flow analysis to estimate bit widths of variables. For example, the compiler 110 generates transfer functions for the blocks of the program 105. Each transfer function represents a minimum bit width of one of the variables in the blocks that is required to preserve correct program semantics, as discussed herein. The transfer functions estimate the bit widths of the variables based on numbers of bits needed to carry out the one or more instructions in the blocks and whether the variables are live in the blocks. The compiler 110 may then use the transfer functions to perform the backwards flow analysis to determine and allocate minimum numbers of bits to represent the variables in the compiled program 105.

Figure 2:
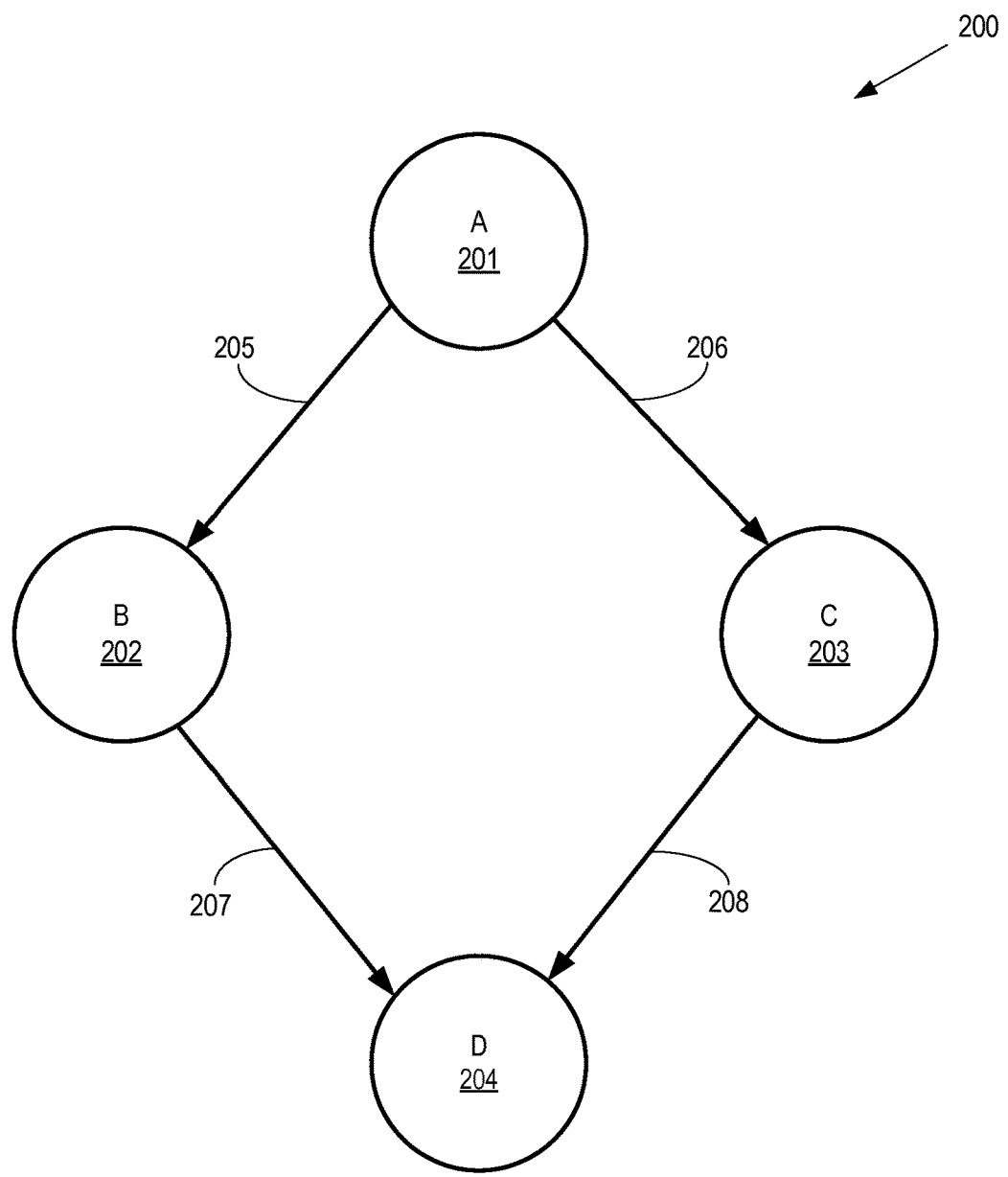
FIG. 2 is a representation of a control flow graph that can be used during compilation of a program according to some embodiments.

FIG. 2 is a representation of a control flow graph 200 that can be used during compilation of a program according to some embodiments. The control flow graph 200 may be generated by some embodiments of the compiler 110 based on portions of the program 105 shown in FIG. 1. The control flow graph 200 includes a plurality of nodes 201, 202, 203, 204 that are referred to collectively as the nodes 201-204. The nodes 201-204 are connected by directed edges 205, 206, 207, 208 that are referred to collectively as the directed edges 205-208. Each of the nodes 201-204 in the control flow graph 200 represents a basic block of the program. As used herein, the terms "block," "basic block," and "program block" refer to a sequence of instructions that has only one entry point and only one exit point. Thus, a block is a straight-line piece of a program without any jumps or jump targets. A block may begin at a jump target, which would be the entry point of the block, and the block may end at a jump instruction, which would be the exit point of the block. The directed edges 205-208 are used to represent jumps in the control flow. Some embodiments of the control flow graph 200 include two specially designated blocks: the entry block 201, through which control enters into the control flow graph 200, and the exit block 204, through which all control flow leaves the control flow graph 200.

The control flow graph 200 may be used to represent the following fragment of code:
- 0: (A) t0=read_num
- 1: (A) if t0 mod 2==0
- 2: (B) print t0+"is even."
- 3: (B) goto 5
- 4: (C) print t0+"is odd."
- 5: (D) end program The above code fragment includes four basic blocks that are labeled with capital letters A, B, C, and D. The block A includes instruction 0 and instruction 1, the block B includes instructions 2 and 3, the block C includes instruction 4, and the block D includes instruction 5. The block A is the entry block of the code fragment and the block D is the exit block of the code fragment. Lines 1 and 3 are jump instructions and lines 4 and 5 are jump targets. Thus, the control flow graph 200 includes the node 201 to represent the block A, the node 202 to represent the block B, the node 203 to represent the block C, and the node 204 to represent the block D. The control flow graph 200 also includes directed edge 205 from A to B, directed edge 206 from A to C, directed edge 207 from B to D, and directed edge 208 from C to D.

Some embodiments of the control flow graph 200 are used to determine whether variables used in the nodes 201-204 are live or not. A variable v is live at an edge E in the control-flow graph 200 if there is a path from E to a use of v along which v is not redefined. For example, the variable t0 may be assigned a value in the node 201. The variable t0 is live along the edge 205 because there is a path from the assignment of the value read_num to the variable in t0 the node 201 to a use of the variable t0 in the node 202 along which the value of the variable t0 is not redefined or assigned a new value.

Figure 3:
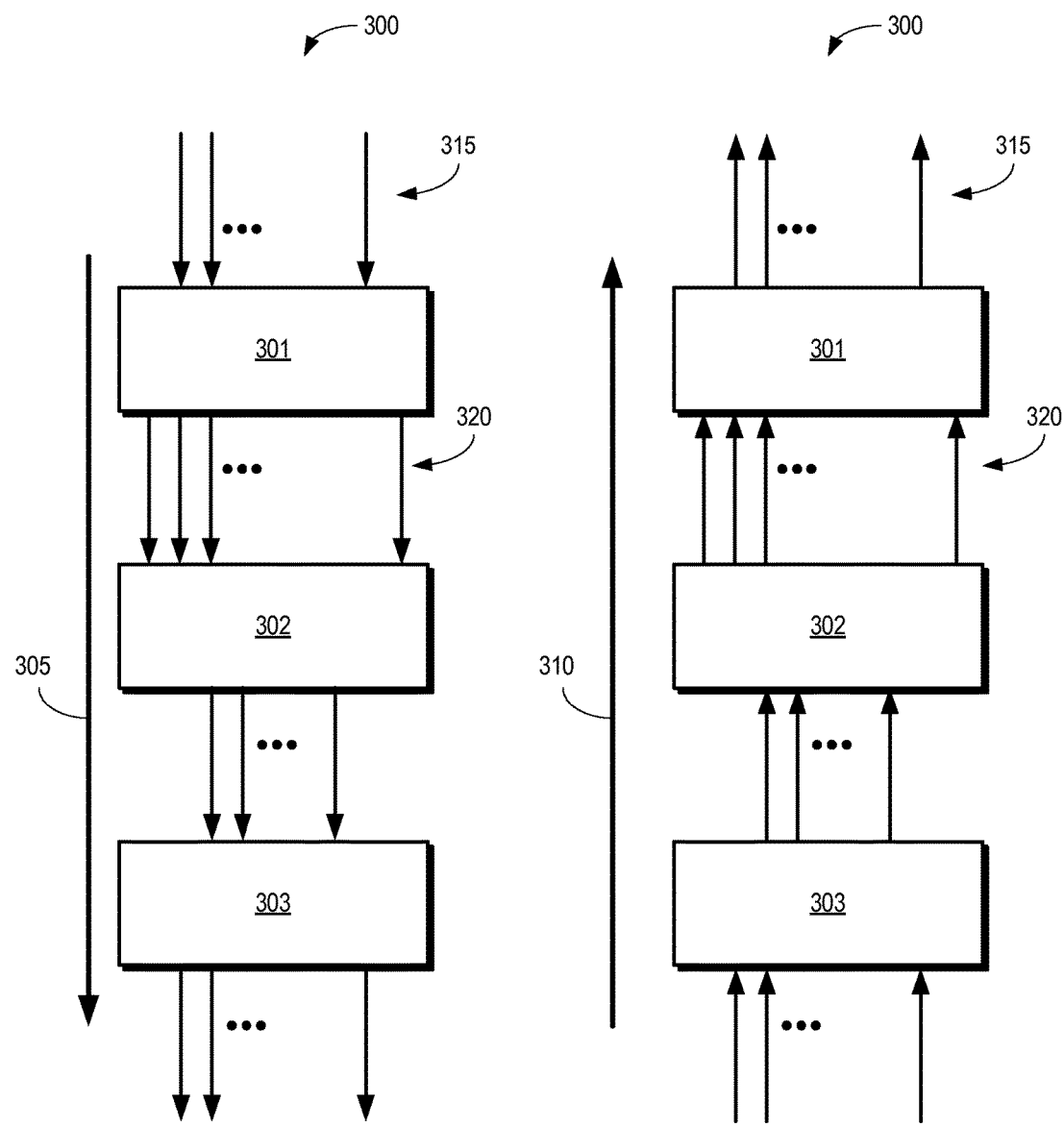
FIG. 3 is a block diagram illustrating input and output variables to blocks of a portion of a program in program order and in reverse program order according to some embodiments.

FIG. 3 is a block diagram illustrating input and output variables to blocks of a portion 300 of a program in program order and in reverse program order according to some embodiments. The portion 300 of the program may represent a portion of the program 105 shown in FIG. 1. The portion 300 shown on the left-hand side of FIG. 3 illustrates input and output variables to blocks 301, 302, 303 (referred to collectively as "the block 301-303") in program order as indicated by the arrow 305. The portion 300 shown on the right-hand side of FIG. 3 illustrates input and output variables to the block 301-303 in reverse program order as indicated by the arrow 310. For example, the variables 315 are input variables to the block 301 in program order and the variables 315 are output variables from the block 301 in reverse program order, as indicated by the different directions of the arrows representing the variables 315.

A lattice or other data structure may be used to represent the minimum number of bits needed to represent each variable in the portion 300 of the program. The lattice element for a variable v is denoted by Size(v) to indicate that the only the least significant Size(v) bits of the variable v are used in the program. Thus, correct program semantics for the portion 300 are preserved if the variable v is represented by at least a minimum number of bits that is equal to Size(v). Representing the variable v with fewer than Size(v) bits would cause the portion 300 to generate incorrect results and therefore would violate correct program semantics for the portion 300. The lattice elements for the portion 300 are determined using a backwards flow analysis that traverses the blocks 301-303 in reverse program order 310. The backwards flow analysis determines the lattice elements for the variables in the portion 300 based on transfer functions that are defined for each of the variables in the blocks 301-303. The transfer functions generate an estimate of bit widths of variables in the blocks 301-303 based on numbers of bits needed to carry out at least one instruction in the corresponding block 301-303 and whether the variables are live in the blocks 301-303. Some embodiments of the transfer functions also generate the bit width estimate based on sizes of the input and output variables of the blocks 301-303.

One example of a transfer function may be defined for the bitwise arithmetic operation:

$$x = y \oplus_s z. \quad (1)$$

The bitwise arithmetic operation in equation (1) operates on integers that are s bits wide in a block such as the block 301. In program order, the variables y and z are input to the block 301 and the variable x is output from the block 301. Depending on the program, the variables y and z may also be output from the block 301 and the variable x may also be input to the block 301. The transfer function for the variable y in the block 301 may therefore be written as:

$$Size_y(s_x, s_y) = Max(s_y, Min(s_x, s)), \quad (2)$$

where $Size_y$ is the bit width required to preserve correct program semantics within the block 301. The lattice element $Size_y$ is therefore also the minimum bit width of the output variable y in reverse program order. The bit widths of the input variables x and y are represented by $s_x$ and $s_y$, respectively. The transfer function sets a lower bound on $Size_y$ that is equal to the minimum value of s and $s_x$. The lower bound is used because the variable y must have at least the number of bits required by the bitwise arithmetic operation and the number of bits used by the variable x. The value of $Size_y$ must also be at least as large as the number of bits required to preserve correct program semantics in subsequent blocks 302, 303 and so the value of $Size_y$ must also be at least $s_y$. A corresponding transfer function may also be defined for the variable z in the block 301. No transfer function is defined in the block 301 for the variable x based on the bitwise arithmetic operation because this operation assigns a new value to the variable x and therefore "kills" the variable x.

The transfer function for the bitwise arithmetic operation is monotonic, as demonstrated by the following proof.

---

Consider only pairs ($s_x$, $s_y$) corresponding to elements of x and y (instead of n-tuples for n variables)
$Size_y(s_x, s_y) = Max(s_y, Min(s_x, s))$
To show: (s1, s2) ≤ (s3, s4) ⇒ $Size_y$(s1, s2) ≤ $Size_y$(s3, s4)
Four cases:
* $s_2 \leq s_4$
* $Min(s_1, s)$ vs $s_4$:
   $s_1 \leq s_3 \Rightarrow Min(s_1, s) \leq Min(s_3, s)$ -continued $Min(s_3, s) \le s_4$
$\Rightarrow Min(s_1, s) \le s_4$
* $s_2$ vs $Min(s_3, s)$:
  $s_2 \le s_4$
  $s_4 \le Min(s_3, s)$
  $\Rightarrow s_2 \le Min(s_3, s)$
* $Min(s_1, s) \le Min(s_3, s)$ (Follows for $s_1 \le s_3$)

Another example of a transfer function may be defined for the shift-right operation $x=shr\_s(v,c)$ that shifts s bits of the variable v to the right by a constant number of bits c and assigns the shifted bits to the variable x. The transfer function for the variable v in the block that includes the shift-right operation may be written as:

if $(s_x==0)$ then $Size_v=s_v$ else $Size_v=Max(s_v,Min(s_x+c,s))$. (3)

The lattice element $Size_v$ is the minimum bit widths of the output variable v of the corresponding block in reverse program order and is therefore the minimum bit width required to preserve correct program semantics in subsequent blocks. The bit width of the input variable v is represented by $s_v$.

Monotonicity of the transfer function for the shift-right operation is demonstrated by the following proof:

To show: $(s1, s2) \le (s3, s4) \Rightarrow f_{shr}(s1, s2) \le f_{shr}(s3, s4)$
(s1, s2) : (incoming size of x, incoming size of v)
Recap: $f_{shr}(s1, s2) = s_2$ if $(s_1 == 0)$; else $Max(s_2, Min(s_1 + c, s))$
Four cases:
  * $s1 \le 0 \Rightarrow s1 \le f_{shr}(s3, s4)$
  * $s1 \ne 0 \Rightarrow s3 \ne 0$ (since $s3 \le 0$)
    $Max(s_2, Min(s_1 + c, s))$ vs $Max(s_4, Min(s_3 + c, s))$
    Argument similar to $x = y \otimes z$ Another example of a transfer function may be defined for the convert operation $x=cvt\_s1\_s2(v)$ that converts the variable v from s2 bits to s1 bits and assigns the converted variable to the variable x. The transfer function for the variable v in the block that includes the convert operation may be written as:

$Size_v=Max(s_v,Min(s_x,s2))$. (4)

Monotonicity of the transfer function for the convert operation may be demonstrated using a proof similar to the proofs presented above for the bitwise arithmetic operation and the shift-right operation.

Another example of a transfer function may be defined for the carry operation $x=carry_s(y,z)$ that assigns a value of 1 to the variable x if the operation y+z results in a carry and assigns a value of 0 otherwise. The transfer function for the variable y is represented as:

if $(s_x \ne 0)$ then $Size_y=Max(s_y,s)$ else $Size_y=s_y$. (5)

In the illustrated embodiment, the bit widths for all of the variables are initialized to a predetermined value of zero at the exit node of the program. Thus, the transfer function indicates that if the variable x is live (because the value $s_x$ is no longer equal to the predetermined initialization value of zero) then the bit width of the variable y is lower-bounded by the size of the operation. Otherwise, the bit width of the variable y is the same as the previous estimate of the bit width of the variable y, i.e., the input value $s_y$. A similar transform function may also be defined for the variable z in the carry operation.

In some cases, the compiler may not be able to determine how (or even if) an instruction or block uses a variable. A conservative transfer function can be defined for this type of instruction or block by applying a lower bound that is equal to the declared bit width of the variable. For example, the transfer function for the variable v may be defined as:

$Size(v)=Max(Size(v), \text{declared bit width of } v)$

Examples of operations that can be represented by the conservative transfer function include right shifting by an unknown amount, division, load or store of an address operand, store of the data operand, convert-to-float, multimedia operations with non-constant arguments, and the like.

The examples of transfer functions discussed above are used to define transfer functions for individual instructions within a program block. However, transfer functions may also be formed for variables that are used by multiple instructions within a program block, e.g., using linear combinations of the transfer functions for the individual instructions.

The bit widths for variables in the program can be determined using a backwards flow analysis of the portion 300 of the program using the transfer functions for variables in the program blocks 301-303. For example, a backwards flow analysis can be used to determine the bit widths for variables in the following HSAIL program sequence:

x1=lda_private_u32 symbol
x2=cvt_u64_u32 x3;
x4=shl_u64 x2, 2;
x5=cvt_u64_u32 x1;
x6=add_u64 (x5, x4);
x7=cvt_u32_u64 x6;
x8=ld_private_u32 [x7];

The last instruction is the exit node of the program sequence and the bit widths of all of the variables may be initialized to a predetermined value such as zero at the exit node. The bit with of the variable X7 is defined by the HSAIL standard to be an address size of 32 bits so that Size(x7)=32 bits at the last instruction. The variable x8 is not live at the last instruction and so the variable x8 retains its initial value of Size(x8)=0. Proceeding in reverse program order to the next instruction, the transfer function for the variable x6 in the convert operation cvt_u32_u64 indicates that the bit width of the variable x6 is:

$Size(x6)=Max(0,Min(64,Size(x7)=32))=32$.

Continuing in reverse program order, the transfer function for the variables x4 and x5 in the 64-bit addition operation add_u64 indicates that the corresponding bit widths are:

$Size(x4)=Max(0,Min(64,Size(x6)=32))=32$ $Size(x5)=Max(0,Min(64,Size(x6)=32))=32$.

The same process can be repeated using the transfer functions for the variables in the other instructions (and progressing in reverse program order) to determine:

$Size(x1)=Max(0,Min(64,Size(x5)=32))=32$ $Size(x2)=Max(0,Min(64,Size(x4)=32))=32$ $Size(x3)=Max(0,Min(64,Size(x2)=32))=32$.

The last instruction (in reverse program order) is the entry node for the program sequence. The variable x1 is a sign the value at the exit node and the value is not dependent on any of the variables. Consequently, the instruction at the entry node for the program sequence does not constrain the bit widths of any of the variables.

The variables x1-x8 in the above program sequence can all be represented by 32 bits while still preserving correct program semantics. The compiler may use this information to transform 64-bit operations into 32-bit operations and remove any redundant conversions such as a conversion of a variable from 64 bits to 32 bits. For example, the conversion of a variable from 64 bits to 32 bits would become a copy operation on a 32-bit variable, which can be propagated and eliminated from the compiled code. Thus, a compiler can use embodiments of the bit width analysis described herein to avoid expensive 64 bit computations in the compiled code or synthesized hardware.

Figure 4:
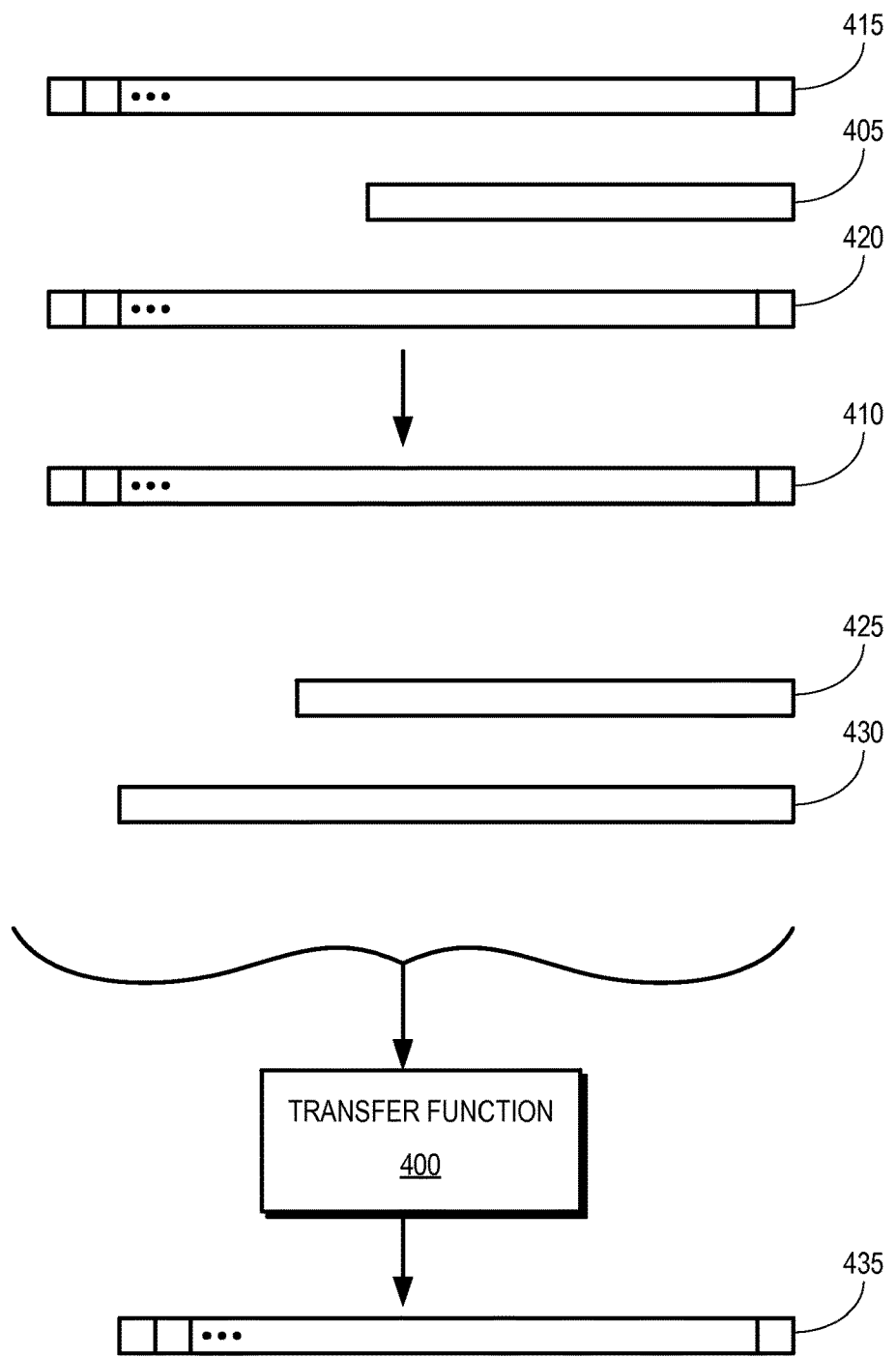
FIG. 4 is a diagram that illustrates operation of a transfer function according to some embodiments.

FIG. 4 is a diagram that illustrates operation of a transfer function 400 according to some embodiments. The transfer function 400 may be used to implement transfer functions for variables in some embodiments of one or more of the blocks 301-303 shown in FIG. 3. The transfer function 400 is defined based on an operation 405 that assigns a value to a variable 410 that is determined by combining the values of two variables 415, 420. For example, the operation 405 may be a bitwise arithmetic operation. The transfer function 400 generates a bit width for the variable 415 that preserves correct program semantics, as discussed herein. Another transfer function (not shown) can be generated for the variable 420. The input (in reverse program order) bit widths of the variables 410, 415 are indicated by the boxes 425, 430, respectively.

The transfer function 400 for the variable 415 may be represented using equation (2). The number of bits 425 needed for the input value of the variable 410 is larger than the number of bits used by the operation 405 so the minimum number of bits between the number of bits 425 and the number of bits used by the operation 405 is equal to the number of bits used by the operation 405. The number of bits 430 needed for the input value of the variable 415 is larger than the number of bits 405. Thus, the transfer function 400 indicates that the number of bits 435 needed to represent the variable 415 is equal to the number of bits 430.

Figure 5:
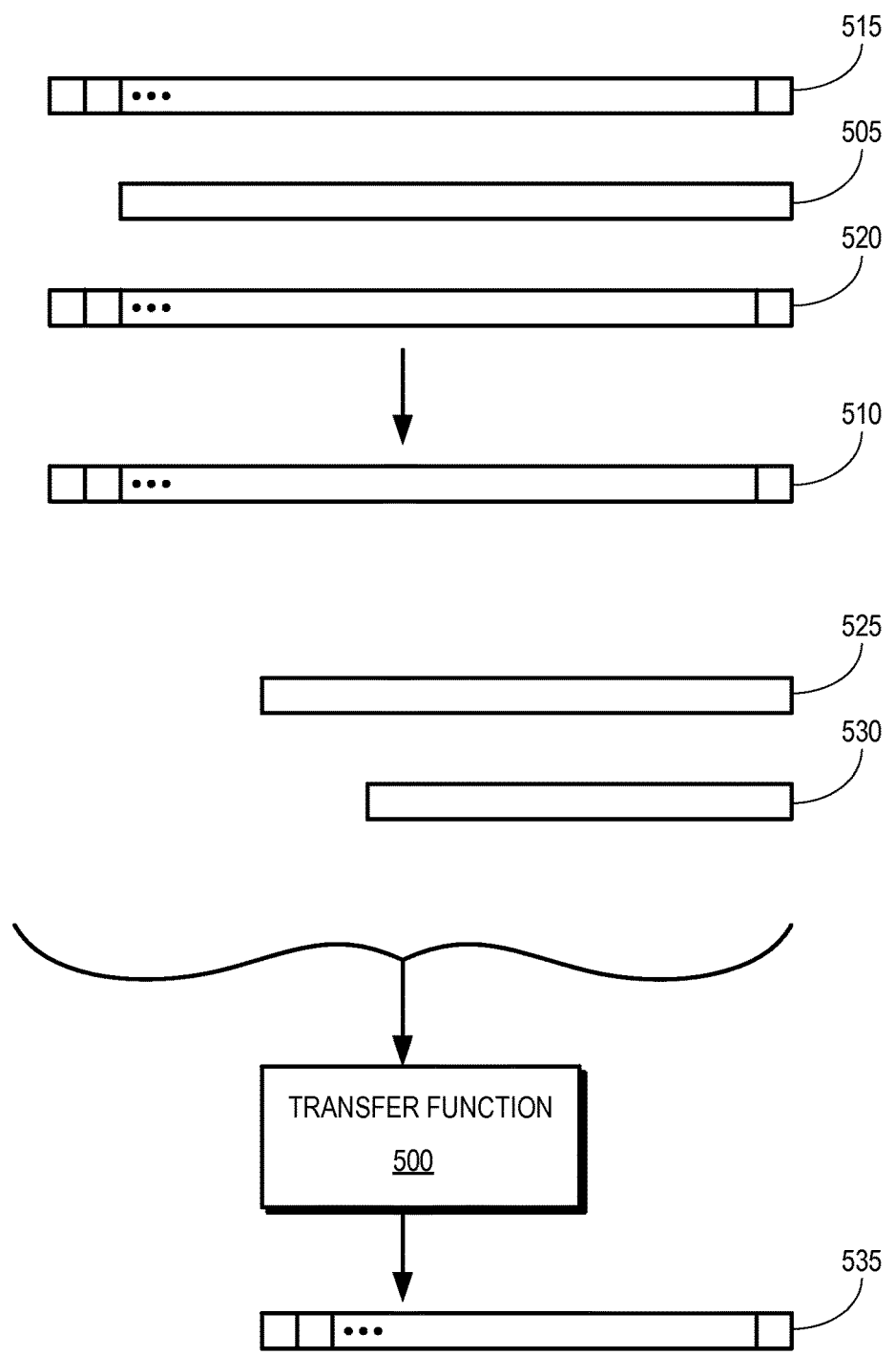
FIG. 5 is a diagram that illustrates operation of the transfer function according to some embodiments.

FIG. 5 is a diagram that illustrates operation of a transfer function 500 according to some embodiments. The transfer function 500 may be used to implement transfer functions for variables in some embodiments of one or more of the blocks 301-303 shown in FIG. 3. The transfer function 500 is defined based on an operation 505 that assigns a value to a variable 510 that is determined by combining the values of two variables 515, 520. For example, the operation 505 may be a bitwise arithmetic operation. The transfer function 500 generates a bit width for the variable 515 that preserves correct program semantics, as discussed herein. Another transfer function (not shown) can be generated for the variable 520. The input (in reverse program order) bit widths of the variables 510, 515 are indicated by the boxes 525, 530, respectively.

The transfer function 500 for the variable 515 may be represented using equation (1). The number of bits 525 needed for the input value of the variable 510 is smaller than the number of bits used by the operation 505. The number of bits 530 needed for the input value of the variable 515 is smaller than the number of bits 525. Thus, the transfer function 500 indicates that the number of bits 535 needed to represent the variable 515 is equal to the number of bits 525.

Figure 6:
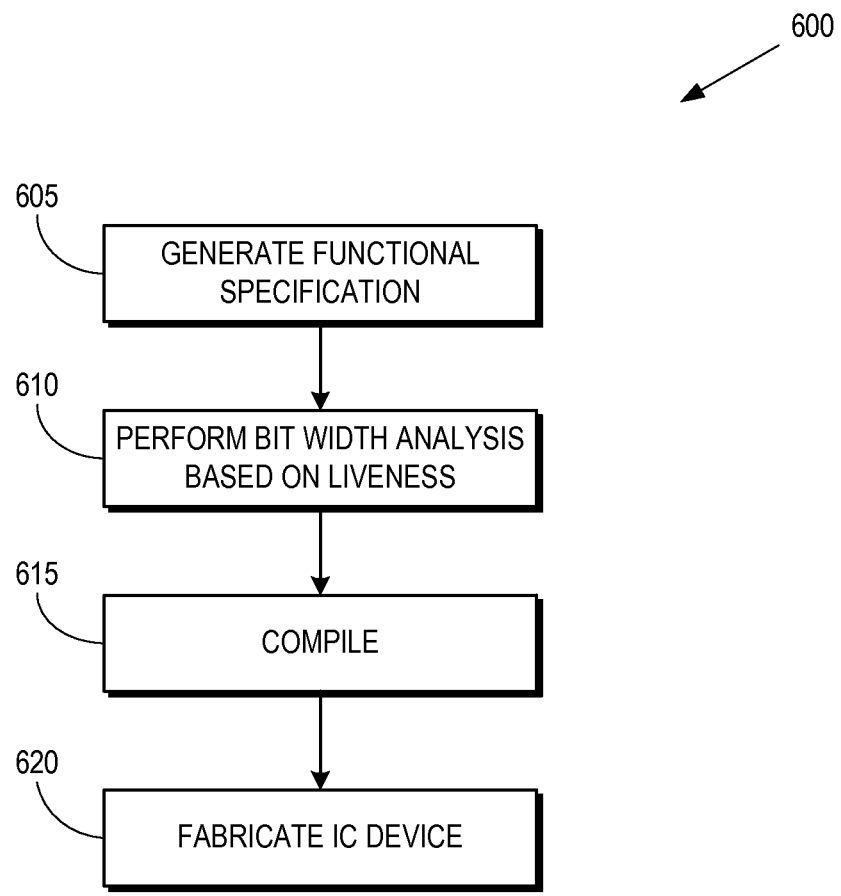
FIG. 6 is a flow diagram illustrating a method for designing and fabricating an integrated circuit device in accordance with some embodiments.

FIG. 6 is a flow diagram illustrating an example method 600 for the design and fabrication of an integrated circuit (IC) device according to some embodiments. The method 600 may be implemented in some embodiments of the processing system 100 and used to fabricate some embodiments of the hardware component 115 shown in FIG. 1. As noted above, the code generated for each of the following processes is stored or otherwise embodied in non-transitory computer readable storage media for access and use by the corresponding design tool or fabrication tool.

At block 605 a functional specification for the IC device is generated. The functional specification (often referred to as a micro architecture specification (MAS)) may be represented by any of a variety of programming languages or modeling languages, including C, C++, SystemC, Simulink, or MATLAB.

At block 610, a compiler such as the compiler 110 shown in FIG. 1 performs bit width analysis to determine estimates of the minimum bit widths for the variables that preserve correct program semantics. The estimate of the bit widths for the variables is performed based on whether or not the variables are live, which may be referred to as estimating the bit widths based on the "liveness" of the variables.

At block 615 the compiler compiles the functional specification to generate code that can be used to fabricate the IC device, as discussed herein.

At block 620, the IC device is fabricated on the basis of the compiled code, e.g., using a hardware synthesizer such as the hardware synthesizer 125 shown in FIG. 1.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
assessing at a compiler, for blocks of a program during compilation of the program, whether the compiler is able to determine how the blocks use variables in the blocks;
generating at the compiler, transfer functions that estimate bit widths of the variables in the blocks based on numbers of bits needed to carry out at least one instruction in the blocks and whether the variables are live in the blocks, the transfer functions being conservative transfer functions when the compiler is unable to determine how the blocks use the variables, the conservative transfer function applying a lower bound to a variable that is equal to a declared bitwidth for the variable; and
allocating, at the compiler, numbers of bits to represent the variables in the compiled program based on the transfer functions.

2. The method of claim 1, wherein allocating the numbers of bits comprises allocating the numbers of bits to guarantee correct program semantics for the compiled program.

3. The method of claim 1, wherein generating the transfer functions comprises generating at least one transfer function for a block of the program that indicates a bit width of a variable that guarantees program semantics for the block of the program and all subsequent blocks of the program.

4. The method of claim 3, wherein generating the at least one transfer function for the block of the program comprises generating at least one transfer function that indicates the bit width of the variable as a function of at least one bit width of at least one live variable that is used in at least one of the subsequent blocks.

5. The method of claim 1, wherein allocating the numbers of bits comprises initializing the numbers of bits to a predetermined value at an exit node of the program.

6. The method of claim 5, wherein allocating the numbers of bits comprises determining, in reverse order beginning at the exit node, the numbers of bits needed to represent the variables at each block to guarantee correct program semantics for a block under consideration and all subsequent blocks.

7. The method of claim 6, wherein allocating the number of bits comprises setting the numbers of bits equal to values of the numbers of bits associated with the variables at an entry block of the program.

8. The method of claim 1, further comprising:
compiling, at the compiler, the program using the number of bits to represent the variables in the program; and
synthesizing at least one hardware component based on the compiled program.

9. A non-transitory computer readable storage medium embodying a set of executable instructions, the set of executable instructions to manipulate at least one processor to:
assess, for blocks of a program during compilation of the program, whether the compiler is able to determine how the blocks use variables in the blocks;
generate, transfer functions that estimate bit widths of the variables in the blocks based on numbers of bits needed to carry out at least one instruction in the blocks and whether the variables are live in the blocks, the transfer functions being conservative transfer functions when a determination cannot be made as to how the blocks use the variables, the conservative transfer function applying a lower bound to a variable that is equal to a declared bitwidth for the variable; and
allocate numbers of bits to represent the variables in the compiled program based on the transfer functions.

10. The non-transitory computer readable storage medium of claim 9, wherein the set of executable instructions manipulate the at least one processor to allocate the numbers of bits to guarantee correct program semantics for the compiled program.

11. The non-transitory computer readable storage medium of claim 9, wherein the set of executable instructions manipulate the at least one processor to generate at least one transfer function for a block of the program that indicates a bit width of a variable that guarantees program semantics for the block of the program and all subsequent blocks of the program.

12. The non-transitory computer readable storage medium of claim 11, wherein the set of executable instructions manipulate the at least one processor to generate at least one transfer function that indicates the bit width of the variable as a function of at least one bit width of at least one live variable that is used in at least one of the subsequent blocks.

13. The non-transitory computer readable storage medium of claim 9, wherein the set of executable instructions manipulate the at least one processor to initialize the numbers of bits to a predetermined value at an exit node of the program.

14. The non-transitory computer readable storage medium of claim 13, wherein the set of executable instructions manipulate the at least one processor to determine, in reverse order beginning at the exit node, the numbers of bits needed to represent the variables at each block to guarantee correct program semantics for the block under consideration and all subsequent blocks.

15. The non-transitory computer readable storage medium of claim 14, wherein the set of executable instructions manipulate the at least one processor to set the numbers of bits equal to values of the numbers of bits associated with the variables at an entry block of the program.

16. An apparatus comprising:
a hardware component synthesized by providing:
a compiler to:
assess, for blocks of a program during compilation of the program, whether the compiler is able to determine how the blocks use variables in the blocks;
generate, transfer functions that estimate bit widths of the variables in the blocks based on numbers of bits needed to carry out at least one instruction in the blocks and whether the variables are live in the blocks, the transfer functions being conservative transfer functions when the compiler is unable to determine how the blocks use the variables, the conservative transfer function applying a lower bound to a variable that is equal to a declared bitwidth for the variable; and allocate numbers of bits to represent the variables in the compiled program based on the transfer functions.

17. The apparatus of claim 16, wherein the compiler is to initialize the numbers of bits to a predetermined value at an exit node of the program.

18. The apparatus of claim 17, wherein the compiler is to determine, in reverse order beginning at the exit node, the numbers of bits needed to represent the variables at each block to guarantee correct program semantics for the block under consideration and all subsequent blocks.

19. The apparatus of claim 18, wherein the compiler is to set the numbers of bits equal to values of the numbers of bits associated with the variables at an entry block of the program.

20. The apparatus of claim 16, wherein the compiler is to compile the program using the number of bits to represent the variables in the program, and further comprising:
    a hardware synthesizer to synthesize at least one hardware component based on the compiled program.

* * * * *